US009475119B2

(12) United States Patent
Cui et al.

(10) Patent No.: US 9,475,119 B2
(45) Date of Patent: Oct. 25, 2016

(54) MOLDED ARTICLES

(75) Inventors: Yan Cui, Greer, SC (US); David Vincent Bucci, Simpsonville, SC (US); Ganjiang Feng, Greenille, SC (US); Srikanth Chandrudu Kottilingam, Simpsonville, SC (US); Dechao Lin, Greenville, SC (US)

(73) Assignee: General Electric Company, Schenectady, NY (US)

( * ) Notice: Subject to any disclaimer, the term of this patent is extended or adjusted under 35 U.S.C. 154(b) by 958 days.

(21) Appl. No.: 13/566,609

(22) Filed: Aug. 3, 2012

(65) Prior Publication Data

US 2014/0037981 A1  Feb. 6, 2014

(51) Int. Cl.
| | |
|---|---|
| B22D 19/16 | (2006.01) |
| F01D 5/14 | (2006.01) |
| B32B 15/01 | (2006.01) |
| B22D 27/04 | (2006.01) |
| B32B 15/18 | (2006.01) |
| B32B 15/00 | (2006.01) |
| B32B 15/04 | (2006.01) |
| B32B 7/04 | (2006.01) |
| B32B 15/20 | (2006.01) |
| C30B 29/52 | (2006.01) |
| C30B 11/06 | (2006.01) |
| C30B 28/06 | (2006.01) |

(52) U.S. Cl.
CPC ............... *B22D 27/045* (2013.01); *B32B 7/04* (2013.01); *B32B 15/00* (2013.01); *B32B 15/01* (2013.01); *B32B 15/04* (2013.01); *B32B 15/18* (2013.01); *B32B 15/20* (2013.01); *C30B 11/06* (2013.01); *C30B 28/06* (2013.01); *C30B 29/52* (2013.01); *F01D 5/14* (2013.01); *F01D 5/141* (2013.01); *Y10T 428/12493* (2015.01); *Y10T 428/12931* (2015.01); *Y10T 428/12937* (2015.01); *Y10T 428/12944* (2015.01)

(58) Field of Classification Search
CPC ......... B32B 7/04; B32B 15/00; B32B 15/01; B32B 15/04; B32B 15/18; B32B 15/20; B32B 2250/04; B32B 2603/00; Y10T 428/12944; Y10T 428/12937; Y10T 428/12931; Y10T 428/12493
See application file for complete search history.

(56) References Cited

U.S. PATENT DOCUMENTS

| | | | |
|---|---|---|---|
| 3,650,312 A | 3/1972 | Allen | |
| 3,847,203 A * | 11/1974 | Northwood | 164/96 |
| 4,892,919 A | 1/1990 | Leitheiser et al. | |
| 7,762,309 B2 | 7/2010 | Tamaddoni-Jahromi et al. | |
| 2007/0169856 A1 | 7/2007 | Chien | |

(Continued)

FOREIGN PATENT DOCUMENTS

| | | |
|---|---|---|
| EP | 0371221 A2 | 6/1990 |
| EP | 0371221 A3 | 1/1991 |

(Continued)

*Primary Examiner* — Michael E La Villa
(74) *Attorney, Agent, or Firm* — Dority & Manning, P.A.

(57) ABSTRACT

A method comprising introducing a first casting material into a casting mold; applying directional solidification to the first casting material in the casting mold; introducing a second casting material into the casting mold, the second casting material having a different chemical composition than the first casting material; applying directional solidification to the second casting material in the casting mold; and forming a molded article, wherein the molded article comprises a first region.

10 Claims, 4 Drawing Sheets

(56) References Cited

U.S. PATENT DOCUMENTS

2008/0038575 A1* 2/2008 Renteria et al. ............ 428/548
2009/0078390 A1   3/2009 Tamaddoni-Jahromi et al.

FOREIGN PATENT DOCUMENTS

EP            1687107 A2    8/2006
WO    WO2005049248 A2    6/2005

* cited by examiner

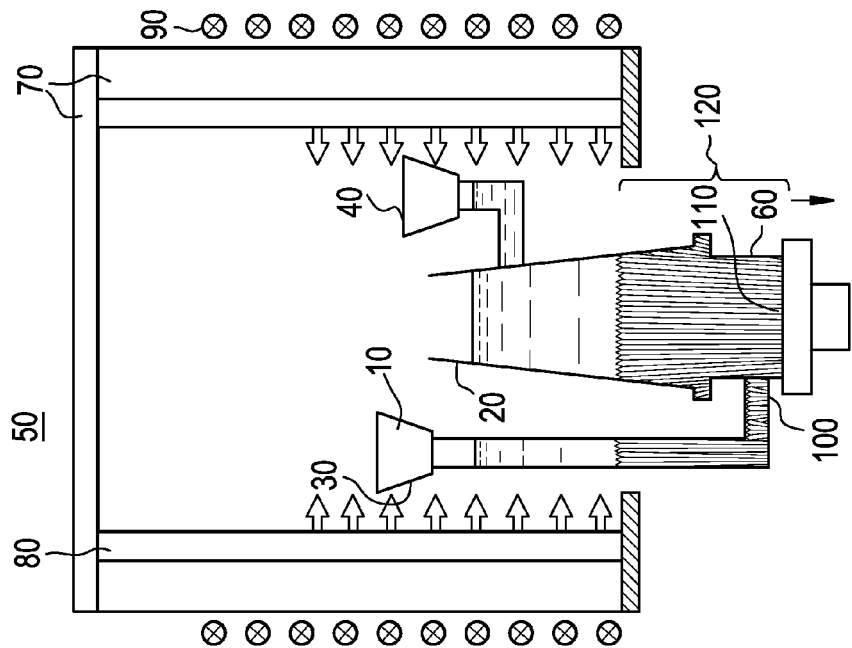
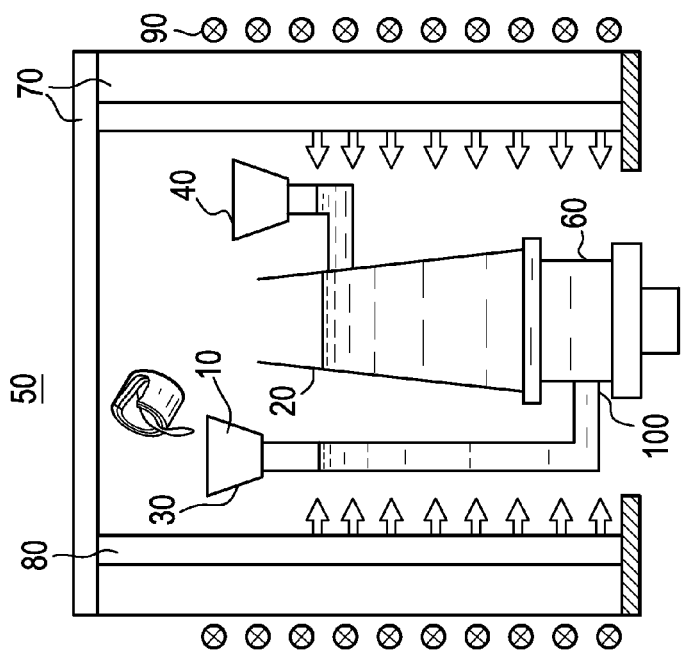

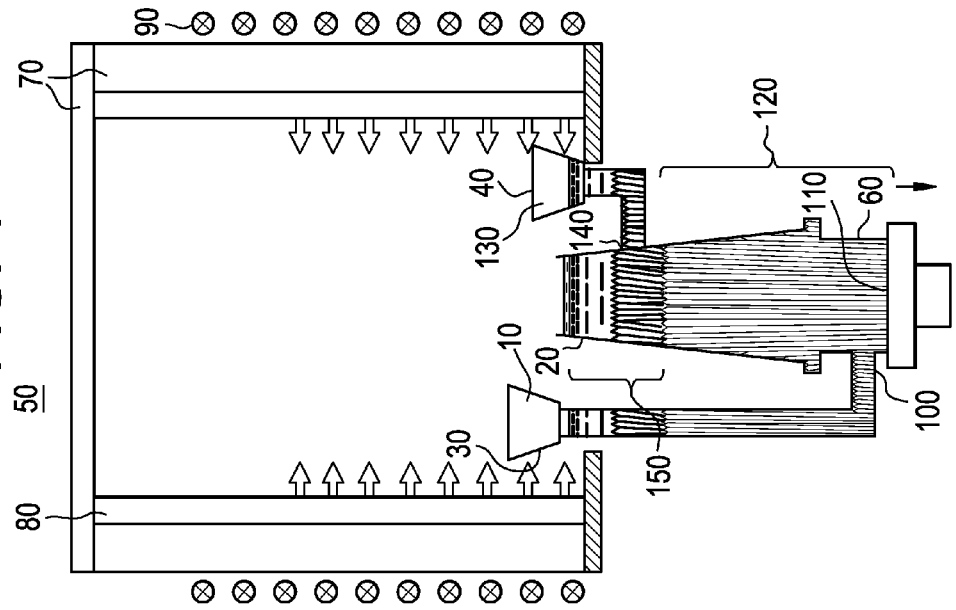
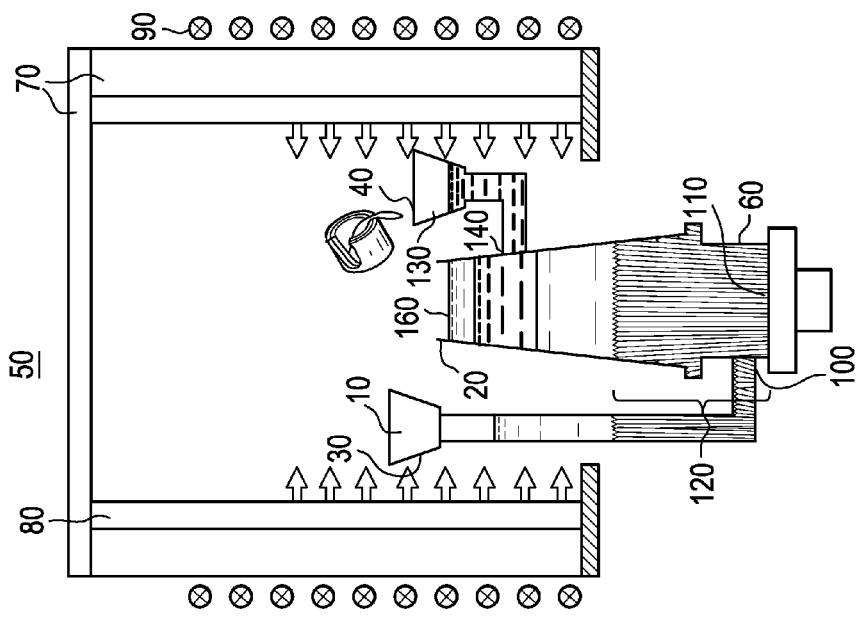

FIG. 6
FIG. 7
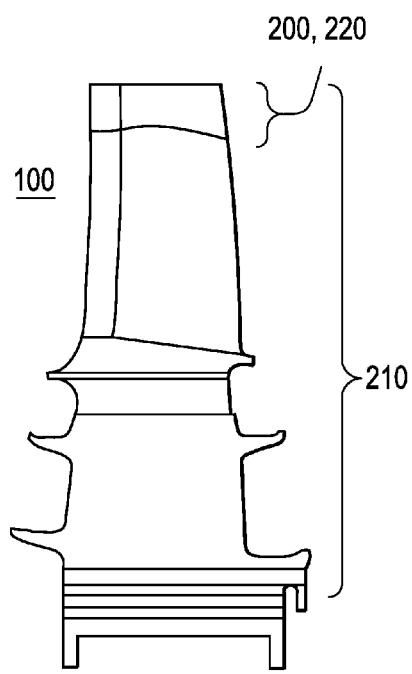
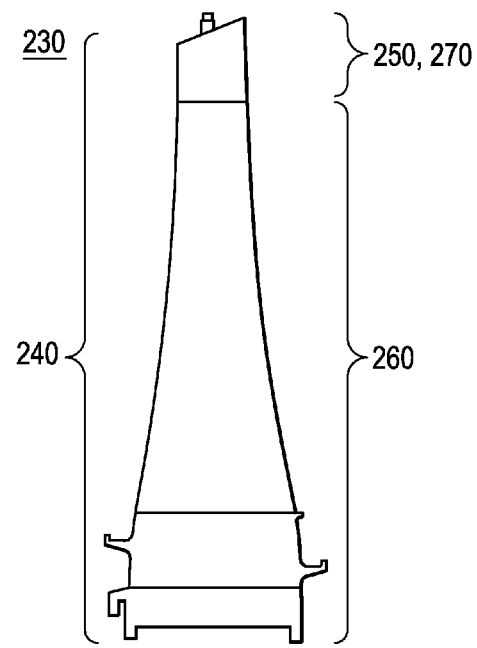

MOLDED ARTICLES

BACKGROUND OF THE INVENTION

The subject matter disclosed herein relates to casting methods, and more particularly to casting methods which provide targeted reinforcement to molded articles provided therefrom by improving at least one physical property.

Casting is a process for shaping a material into a solid article. Casting provides an efficient and economical commercial manufacturing process for producing molded articles having desired and/or complex shapes. In the casting process, a liquid material is poured or introduced into a mold containing a hollow cavity of the desired shape where the liquid material solidifies upon cooling. The newly formed solid is referred to as a "casting." Once solidified, the casting is removed from the mold.

In metal casting, the liquid material is a molten or liquid metal material. Metal casting is used to produce a number of components used in gas turbine engines. One approach to casting gas turbine engine components is to cast multiple components, such as a turbine blade and a squealer tip of a gas turbine engine bucket, in a single metal casting using a single metal casting material. Such an approach allows for multiple components to be cast as a single integral piece, rather than separate components to be joined together by welding, brazing or other methods. Casting multiple components as a single casting also reduces processing costs by reducing the total number of casting procedures used to produce the components.

Metal castings which are used as gas turbine engine components are subjected to various physical stresses during the operation of the gas turbine engine. Gas turbine engine components which are subjected to high temperatures, rubbing, e.g., between the squealer tip of a turbine blade and a housing, or rotary motion suffer from wear, fatigue, reduced tensile strength and/or creep stress, resulting in cracking and material loss. These physical stresses detrimentally affect the performance of the gas turbine engine component, leading to an increase in repairs, an increase in the frequency of routine service interval periods, and a decrease in the overall lifetime of use of the gas turbine engine component before the component is replaced. Such repairs, routine maintenance and replacement represent a substantial economic cost.

Particular regions of gas engine turbine components which have undergone cracking and/or material loss due to these physical stresses are re-built using welding or brazing methods. One drawback associated with the use of welding or brazing methods to repair damaged regions of gas turbine engine components is that the welding or brazing material used to re-build the damaged region has poor oxidation resistance due to the weldability properties of the welding or brazing material. Consequently, the degree to which the welding or brazing repair extends the lifetime of the component is limited by the poor oxidation resistance of the welding or brazing material.

Therefore, a need exists for a method of casting which provides targeted reinforcement to molded articles in order to improve at least one physical property, such as oxidation resistance, wear resistance, fatigue resistance, creep strength, tensile strength and high temperature resistance, or a combination comprising at least one of the foregoing, and/or to improve weld fabrication properties, thereby extending the period of time between repairs, routine service intervals and/or the lifetime of the gas turbine component.

BRIEF DESCRIPTION OF THE INVENTION

According to one aspect of the invention, a method comprises introducing a first casting material into a casting mold; applying directional solidification to the first casting material in the casting mold; introducing a second casting material into the casting mold, the second casting material having a different chemical composition than the first casting material; applying directional solidification to the second casting material in the casting mold; and forming a molded article, wherein the molded article comprises a first region formed by the first casting material and a second region formed by mixing a molten or liquid portion of the first casting material and the second casting material and the first region and the second region are cast as one integral casting, the second region having at least one improved physical property relative to the first region.

According to another aspect of the invention, a molded article comprises a first region formed by a first casting material; and a second region formed by mixing a molten or liquid portion of the first casting material and a second casting material, wherein the first casting material has a different chemical composition than the second casting material, the first region and the second region are cast as one integral casting using directional solidification and the second region comprises at least one improved physical property relative to the first region.

These and other advantages and features will become more apparent from the following description taken together in conjunction with the accompanying drawings in which:

FIG. 1 is a schematic representation of a casting apparatus in which a first casting material is introduced into a casting mold;

FIG. 2 is a schematic representation of a casting apparatus in which a first casting material is subjected to directional solidification;

FIG. 3 is a schematic representation of a casting apparatus in which a second casting material is introduced into a casting mold;

FIG. 4 is a schematic representation of a casting apparatus in which a second casting material is subjected to directional solidification;

FIG. 6 is an enlarged view of a Stage 1 bucket for a gas turbine engine; and

FIG. 7 is a schematic representation of an enlarged view of a latter stage bucket for a gas turbine engine.

Figure 5:
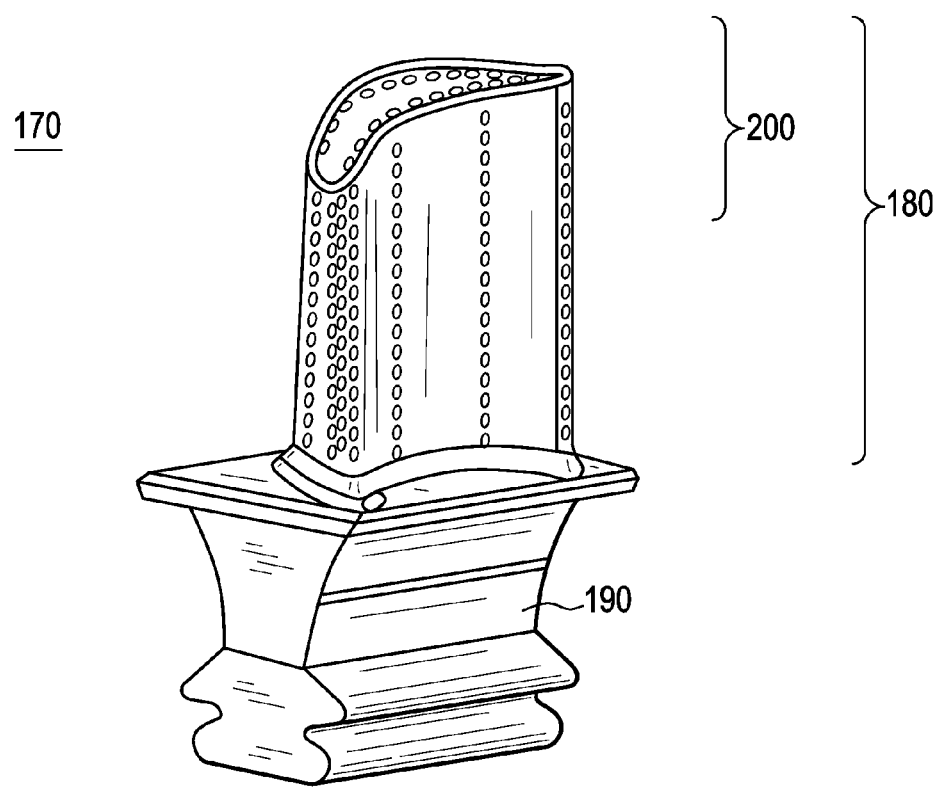
FIG. 5 is a schematic representation of a stage 1 bucket for a gas turbine engine.

The detailed description explains embodiments of the invention, together with advantages and features, by way of example with reference to the drawings.

DETAILED DESCRIPTION OF THE INVENTION

Embodiments described herein generally relate to casting methods and articles produced therefrom, and more particularly to casting methods which provide targeted reinforcement to molded articles provided therefrom by improving at least one physical property.

With reference to FIG. 1, a method comprises introducing a first casting material 10 into a casting mold 20 and applying directional solidification to the first casting material 10 in the casting mold 20. As described further herein in FIGS. 2-7, the method further comprises introducing a second casting material into the casting mold, the second casting material having a different chemical composition than the first casting material; applying directional solidification to the second casting material in the casting mold; and forming a molded article, wherein the molded article comprises a first region formed by the first casting material and a second region formed by mixing a molten or liquid portion of the first casting material and the second casting material and the first region and the second region are cast as one integral casting, the second region having at least one improved physical property relative to the first region.

The casting mold 20 has a first inlet 30 and a second inlet 40. The casting mold 20 is an investment casting mold. Investment casting, also known as lost-wax casting, is a process in which a casting mold is produced by surrounding, or investing, an expendable or non-expendable casting mold pattern with a refractory material. The casting mold pattern is removed from the casting mold prior to introducing a casting material into the casting mold.

The casting mold 20 is part of a directional solidification investment casting apparatus 50. Directional solidification is induced by equipping the casting mold 20 with chills 60, insulating sleeves 70, susceptors 80 and induction coils 90 for radiating heat toward the casting mold 20 via the susceptors 80, which together form the directional solidification investment casting apparatus 50. Other equipment is used in conjunction with the casting mold 20 in order to induce, control or enhance directional solidification of one or more casting materials.

The first casting material 10 is poured or otherwise introduced into the casting mold 20 via a first inlet 30, illustrated as a pouring cap, at a first inlet entry point 100. The first casting material 10 is a molten, liquid or fluid metal alloy or superalloy. As used herein, the term "alloy" refers to a mixture or metallic solid solution having metallic properties and composed of two or more chemical elements of which at least one is a metal. As used herein, the term "alloy" is inclusive of one or more superalloys. As used herein, the term "superalloy" refers to an alloy capable of withstanding high temperatures, high stresses, and/or high oxidation conditions.

Examples of the first casting material 10 include, but are not limited to, in no particular order, alloys of nickel, chromium, cobalt, aluminum, titanium, molybdenum, tungsten and tantalum or a combination comprising at least one of the foregoing. In one embodiment, the first casting material 10 comprises an alloy of nickel, chromium, cobalt, aluminum, titanium, molybdenum, tungsten and tantalum.

In one embodiment, the base alloying element of the first casting material 10 is nickel, cobalt or nickel-iron. As used herein, the term "base alloying element" refers to an element present on the alloy in an amount equal to and/or greater than about 50 wt % of the base alloying element based on the total weight of the casting material. In another embodiment, the base alloying element of the first casting material 10 is nickel.

In another embodiment, the first casting material 10 comprises about 50 wt % to about 70 wt % nickel, about 5 wt % to about 25 wt % chromium, about 5 wt % to about 15 wt % cobalt, about 0.1 wt % to about 10 wt % aluminum, about 0.1 wt % to about 10 wt % titanium, about 0.1 wt % to about 5.0 wt % molybdenum, about 0.01 wt % to about 0.50 wt % tungsten and about 0.1 wt % to about 10.0 wt % tantalum, based on the total weight of the first casting material 10.

In yet another embodiment, the first casting material 10 comprises about 55 wt % to about 65 wt % nickel, about 10 wt % to about 20 wt % chromium, about 7 wt % to about 13 wt % cobalt, about 1 wt % to about 5 wt % aluminum, about 2 wt % to about 8 wt % titanium, about 0.5 wt % to about 3 wt % molybdenum, about 0.05 wt % to about 0.3 wt % tungsten and about 1.0 wt % to about 5.0 wt % tantalum, based on the total weight of the first casting material 10.

In still yet another embodiment, the first casting material 10 comprises about 57 wt % to about 63 wt % nickel, about 12 wt % to about 16 wt % chromium, about 7 wt % to about 11 wt % cobalt, about 2 wt % to about 4 wt % aluminum, about 4 wt % to about 6 wt % titanium, about 1 wt % to about 2 wt % molybdenum, about 0.08 wt % to about 0.20 wt % tungsten and about 2 wt % to about 4 wt % tantalum, based on the total weight of the first casting material 10.

Referring to FIG. 2, the casting method further comprises applying directional solidification to the first casting material 10 in the casting mold 20. As used herein, the term "directional solidification" refers to a particular type of casting in which solidification of a casting material first occurs at the farthest end from a casting material inlet, or at a base of a casting mold. The, solidification, or the solidification front (solid-liquid interface), of the casting material, progresses toward the casting material inlet, or away from the base of the casting mold. Directional solidification is a high gradient process, having a large G/R ratio where G is a temperature gradient at the solidifying front and R is the withdrawal rate of the casting mold 20 from the direct solidification investment casting apparatus 50, or a furnace.

During directional solidification, the first casting material 10 is drawn, or shrinks, in a downward motion toward a base 110 of the casting mold 20. Solidification of the first casting material 10 occurs first at the base 110 of the casting mold 20. The solidification front of the first casting material 10 moves in a direction toward the first inlet 30, or in a direction away from the base 110 of the casting mold 20.

The directional solidification of the first casting material 10 forms a first region 120 in the casting mold 20. Although the microstructure pattern depicted in FIG. 2 shows a microstructure pattern including a columnar microstructure pattern, the microstructure pattern of the first region is not limited thereto. The microstructure pattern of the first region 120 formed by the direct solidification of the first casting material 10 is columnar, single crystal, equiaxed (not shown), polycrystalline or a combination comprising at least one of the foregoing.

As used herein, the term "columnar" or "columnar grain growth" refers to a microstructure pattern which has grains parallel to the major stress axes. Upon application of directional solidification, columnar grain growth occurs in a vertical direction away from the base 110 of the casting mold 20, or parallel to an axis of the molded article, e.g., a gas turbine engine blade. Columnar microstructure patterns exhibit anisotropic properties, in which the properties of a solidified casting material(s) vary with different crystallographic orientations, and are directionally transformed, or grown, into a columnar structure during directional solidification. Columnar microstructure patterns are devoid or substantially devoid of grain boundaries.

As used herein, the term "devoid" or "substantially devoid" refers to a material having a particular element, composition or property in an amount of about 0 to about 5 wt %, based on the total weight of the material, or in an amount so negligible so as to not impart a significant change in the physical properties of the material.

Grain boundaries are interfaces where crystals of two different orientations meet in a microstructure pattern. A grain boundary is a single-phase interface, with crystals on each side of the grain boundary being formed of the same casting material except in orientation. Grain boundary areas contain those atoms that have been perturbed from their original lattice sites, dislocations, and impurities that have migrated to the lower energy grain boundary. The absence of grain boundaries in a casting, or molded article, provides improved creep strength properties to the molded article in high temperature applications in excess of about 600° C.

As used herein, the term "single crystal" refers to a microstructure pattern which has single crystal cell grains, all of which are oriented in the same direction. Single crystal microstructure patterns exhibit anisotropic properties, having no grain boundaries, and impart low creep fatigue or improved creep strength to the molded article in high temperature applications in excess of about 600° C.

As used herein, the term "equiaxed" refers to a microstructure pattern which has spherical, randomly oriented crystals that have axes of approximately the same length. Equiaxed microstructure patterns exhibit isotropic properties, and provide improved tensile strength to the molded article in high temperature applications in excess of about 600° C.

As used herein, the term "polycrystalline" refers to a microstructure pattern which is made up of a number of smaller crystals known as crystallites, and paracrystalline phases.

In one embodiment, the first region 120 has a columnar microstructure pattern. In another embodiment, the first region 120 has an equiaxed microstructure pattern. In yet another embodiment, the first region 120 has a single crystal microstructure pattern. In still yet another embodiment, the first region 120 has a columnar and a single crystal microstructure pattern.

The first region 120 is formed by atom exchange, an interstitial mechanism or a combination thereof. In one embodiment, the first region 120 is homogeneous, having a single phase microstructure pattern. In another embodiment, the first region 120 is heterogeneous, having a microstructure having two or more phases. In yet another embodiment, the first region 120 is intermetallic, having no distinct grain boundary between two or more phases in a microstructure pattern. In still yet another embodiment, the first region 120 comprises secondary phase precipitates such as gamma prime and carbides. In still another embodiment, the first region 120 comprises an ordered phase in matrix of a disordered phase.

The microstructure pattern of the first region 120 is controlled by controlling the particular casting conditions relative to a particular first casting material 10. The first casting material, pouring rate, pouring temperature and/or the withdrawal rate of the first casting material 10 are adjusted to form the desired microstructure pattern and to produce the desired physical properties in the solidified first region 120. In one embodiment, the withdrawal rate of the first casting material 10 is adjusted to match a growth rate of the particular first casting material 10 employed.

Referring to FIG. 3, prior to the complete solidification of the first casting material 10, when at least a portion of the first casting material 10 is still in a liquid or molten phase, a second casting material 130 is introduced into the casting mold 20. Solidification initiates when a casting material reaches its liquidus temperature.

The second casting material 130 is poured or otherwise introduced into the casting mold 20 via a second inlet 40 at a second inlet entry point 140. The second casting material 130 is a molten or fluid metal alloy or superalloy. The second casting material 130 has a different chemical composition than the first casting material 10, whether or not the microstructure pattern of the first region is the same as, similar to or different than the microstructure pattern of the second region.

Examples of the second casting material 130 include, but are not limited to, in no particular order, alloys of cobalt, chromium, molybdenum, tungsten, tantalum, aluminum, hafnium, nickel or a combination comprising at least one of the foregoing. In one embodiment, the second casting material 130 is an alloy comprising cobalt, chromium, molybdenum, tungsten, tantalum, aluminum, hafnium, carbon, boron and nickel.

In one embodiment, the second casting material 130 is devoid or substantially devoid of titanium and/or aluminum. In another embodiment, the second casting material 130 further comprises hafnium, carbon and/or boron.

In one embodiment, the base alloying element of the second casting material 130 is nickel, cobalt or nickel-iron. In another embodiment, the base alloying element of the second casting material 130 is nickel.

In one embodiment, the second casting material 130 comprises about 50 wt % to about 70 wt % nickel, about 1 wt % to about 20 wt % chromium, about 1 wt % to about 20 wt % cobalt, about 0.1 wt % to about 15 wt % aluminum, about 0.01 wt % to about 5.0 wt % molybdenum, about 1 wt % to about 20 wt % tungsten and about 0.1 wt % to about 10.0 wt % tantalum, based on the total weight of the second casting material 130. In yet another embodiment, the second casting material 130 further comprises about 0.1 wt % to 5.0 wt % hafnium, 0.01 wt % to 5.0 wt % carbon and/or 0.001 wt % to 1.000 wt % boron, based on the total weight of the second casting material 130.

In another embodiment, the second casting material 130 comprises about 55 wt % to about 68 wt % nickel, about 3 wt % to about 15 wt % chromium, about 3 wt % to about 15 wt % cobalt, about 1 wt % to about 10 wt % aluminum, about 0.1 wt % to about 3.0 wt % molybdenum, about 5 wt % to about 15 wt % tungsten and about 1 wt % to about 6 wt % tantalum, based on the total weight of the second casting material 130. In yet another embodiment, the second casting material 130 further comprises 0.5 wt % to 3.0 wt % hafnium, 0.01 wt % to 3.00 wt % carbon and/or 0.005 wt % to 1.000 wt % boron, based on the total weight of the second casting material 130.

In yet another embodiment, the second casting material 130 comprises about 58 wt % to about 65 wt % nickel, about 5 wt % to about 12 wt % chromium, about 5 wt % to about 12 wt % cobalt, about 3 wt % to about 8 wt % aluminum, about 0.3 wt % to about 1.0 wt % molybdenum, about 7 wt % to about 13 wt % tungsten and about 2 wt % to about 5 wt % tantalum, based on the total weight of the second casting material 130. In yet another embodiment, the second casting material 130 further comprises 1 wt % to 2 wt % hafnium, 0.05 wt % to 0.25 wt % carbon and/or 0.010 wt % to 0.025 wt % boron, based on the total weight of the second casting material 130.

In one embodiment, the second inlet entry point 140 is positioned such that the second casting material 130 is introduced into the casting mold 20 at a point at which is lower than the upper surface of the remaining liquid or molten phase of the first casting material 10. The second casting material 130 mixes with at least a portion of the first casting material 10 which is still in a liquid or molten phase.

Although depicted separately in FIG. 3, in one embodiment, the first inlet 30 and the second inlet 40, and the first inlet entry point 100 and the second inlet entry point 140, are at the same level. In another embodiment, the first inlet 30 and the second inlet 40, and the first inlet entry point 100 and the second inlet entry point 140, are different and occupy different positions on the casting mold 20 relative to one another. In yet another embodiment, the second inlet entry point 140 is disposed in a position below the position of the first inlet entry point 100 based on their relative positions on the casting mold 20. In still yet another embodiment, the second inlet entry point 140 is disposed in a position below the position of the upper surface of the liquid or molten phase of the first casting material 10.

The casting method further comprises applying directional solidification to the second casting material 130 in the casting mold 20. As the second casting material 130 is mixed with at least a portion of the liquid or molten phase of the first casting material 10, the withdrawal rate is adjusted to match a growth rate of the second casting material 130. The directional solidification of the mixture of the molten or liquid portion of the first casting material 10 and the second casting material 130 forms a second region 150 in the casting mold 20. The first region 120 and the second region 150 are cast as a single, integral casting, or molded article, using directional solidification.

In one embodiment, the interface between the first region 120 and the second region 150 is devoid or substantially devoid of an oxidation layer. As used herein, the term "oxidation layer" refers to a layer which forms at an upper surface of a molten or liquid phase casting material in a casting mold. As used herein, the term "upper" refers to a portion of a given material above its midline, above its three-quarter-line, or above its 90% line as measured from the base of the material based on the total area of the material. The second casting material 130 is introduced into the casting mold 20 via a second inlet entry point 140 positioned below the remaining molten or liquid phase of the first casting material 10. Upon introduction of the second casting material 130 and/or application of directional solidification, the oxidation layer 160 is pushed upward toward the an upper portion of the mixture of the molten or liquid phase of the first casting material 10 and the second casting material 130, or to an upper portion of the second region 150. This oxidation layer is removed, for example, by scraping or skimming during post-processing procedures.

In another embodiment, the interface between the first region 120 and the second region 150 is devoid or substantially devoid of a grain boundary. The first region 120 and the second region 150 each comprise at least one of a columnar or single crystal microstructure pattern.

In yet another embodiment, the interface between the first region 120 and the second region 150 is devoid or substantially devoid of at least one impurity which is present in the first casting material 10 and/or the second casting material 130. The application of directional solidification causes one or more impurities (not shown) which are present in the liquid or molten phase of the first casting material 10 and/or the second casting material 130 to be pushed up to an upper portion of the liquid or molten phase of the mixture of the first casting material 10 and the second casting material 130, or to an upper portion of the second region 150. Since a number of impurities are more soluble in a liquid casting material than a solidified casting material, such impurities will be pushed upward by the solidification front. The last of the mixture of the first casting material 10 and the second casting material 130 to be solidified will become enriched with these impurities, and like or along with the oxidation layer, is skimmed, scraped or otherwise removed from the casting in post-processing procedures. The resulting casting will have a lower concentration of impurities than were initially present in the first casting material 10 and the second casting material 130 when they each were introduced into the casting mold 20.

In one embodiment, the second region 150 comprises the second casting material 130 and is devoid or substantially devoid of the first casting material 10, excluding any oxidation layer or impurity layer, as described herein. In another embodiment, the second region 150 comprises a mixture of the first casting material 10 and the second casting material 130, wherein a new alloy or superalloy is formed in situ upon the mixing of the first casting material 10 with the second casting material 130, excluding any oxidation layer 160 or impurity layer, as described herein.

Referring to FIG. 4, the microstructure pattern of the second region 150 formed by the direct solidification of the mixture of the first casting material 10 and the second casting material 130 is columnar, single crystal, equiaxed or a combination of two or more of the foregoing. In one embodiment, the second region 150 comprises a columnar microstructure pattern. In another embodiment, the second region 150 comprises a single crystal microstructure pattern. In yet another embodiment, the second region 150 comprises a single crystal and columnar microstructure pattern. In still yet another embodiment, the second region 150 further comprises an equiaxed microstructure pattern. The microstructure of the second region 150 is controlled by controlling the particular casting conditions relative to the second casting material 130. The pouring rate and/or pouring temperature are adjusted to form the desired microstructure pattern.

In one embodiment, the first region 120 has a microstructure pattern that is different than the microstructure pattern of the second region 150. In another embodiment, the first region 120 has a microstructure pattern selected from a columnar microstructure, single crystal microstructure or a combination thereof and the second region has a microstructure pattern selected from a single crystal microstructure, an equiaxed microstructure or a combination thereof. In yet another embodiment, the microstructure pattern of the first region 120 is columnar and single crystal and the microstructure pattern of the second region 150 is single crystal and equiaxed. In still yet another embodiment, the number of single crystals formed in the second region 150 is greater than a number of single crystals formed in the first region 120.

The second region 150 is formed by atom exchange, an interstitial mechanism or a combination thereof. In one embodiment, the second region 150 is a homogeneous, having a single phase microstructure pattern. In another embodiment, the second region 150 is heterogeneous, having a microstructure having two or more phases. In yet another embodiment, the second region 150 is intermetallic, having no distinct grain boundary between two or more phases in a microstructure pattern. In still yet another embodiment, the second region 150 comprises secondary phase precipitates such as gamma prime and carbides. In still another embodiment, the second region 150 comprises an ordered phase in matrix of a disordered phase.

Upon complete solidification the of the second region 150, the resulting casting, comprising the first region 120 and the second region 150, forms a molded article, and is removed from the casting mold 20. The molded article is then subjected to various post-processing procedures to make the molded article suitable for installation and operation in a particular application. The resulting molded article is formed of a hybrid material having multiple regions, each obtained from a different alloy or superalloy casting material.

In one embodiment, the second region 150 is formed by about 60 wt % to about 100 wt % of the second casting material 130 and about 0 wt % to about 40 wt % of the first casting material 10, based on the total weight of the resulting second region, excluding any oxidation layer 160 or impurity layer removed in post-processing procedures. In another embodiment, the second region 150 is formed by about 65 wt % to about 95 wt % of the second casting material 130 and about 5 wt % to about 35 wt % of the first casting material 10, based on the total weight of the resulting second region, excluding any oxidation layer 160 or impurity layer removed in post-processing procedures. In yet another embodiment, the second region 150 is formed by about 75 wt % to about 90 wt % of the second casting material 130 and about 10 wt % to about 25 wt % of the first casting material 10, based on the total weight of the resulting second region, excluding any oxidation layer 160 or impurity layer removed in post-processing procedures. In still yet another embodiment, the second region 150 is formed by about 95 wt % to about 100 wt % of the second casting material 130 and about 0 wt % to about 5 wt % of the first casting material 10, based on the total weight of the resulting second region, excluding any oxidation layer 160 or impurity layer removed in post-processing procedures.

The second region 150 has at least one improved physical property relative to the same physical property in the first region 120, measured using the same testing conditions. The first region 120 and the second region 150 form a functionally graded, multi-layer molded article. Functionally graded, multi-layered molded articles having three or more functionally graded layers are formed by similarly incorporating additional functionally graded layers as desired based on the particular molded article and its application. The direction of a functional gradient between the layers of a multi-layered molded article is in any direction desired based upon the particular application in which the molded article is used.

Also provided herein is a molded article formed using the casting methods described herein. The molded article comprises a first region formed by a first casting material and a second region formed by mixing a molten or liquid portion of the first casting material and a second casting material, wherein the first casting material has a different chemical composition than the second casting material, the first region and the second region are cast as one integral casting using directional solidification and the second region comprises at least one improved physical property relative to the first region. The molded article is tailored to incorporate the second region 150 having the at least one improved physical property into a particular area of a component which is subjected to temperatures up to about 1100° C., frictional motion, rotary motion or other physical and/or thermally induced stresses in a given application. The shape and position of the second region 150 of the molded article is adjusted based on a particular application and/or a particular area for which targeted reinforcement is desired.

In one embodiment, the at least one improved physical property is selected from one of oxidation (corrosion) resistance, wear resistance, fatigue property, creep property, tensile strength, improved weldability, high temperature resistance, reduced thermal cracking, reduced material loss or a combination comprising at least one of the foregoing physical properties. In another embodiment, the at least one improved physical property is oxidation resistance. In yet embodiment, the at least one improved physical property is improved weldability. In still yet another embodiment, a weld or brazing repair to the second region extends a lifetime of the molded article longer than a similar weld or brazing repair extends a lifetime of a molded article formed by a single casting material. In still another embodiment, the at least one improved physical property is a combination comprising oxidation resistance and improved weldability. In still yet another embodiment, the at least one improved physical property is reduced thermal cracking and/or reduced material loss.

The at least one improved physical property exhibited by the second region 150 provides an improvement of about 5% to about 80% relative to the same physical property as measured in the first region 120 using the same testing conditions or standard industry testing conditions. In one embodiment, the at least one improved physical property exhibited by the second region 150 provides an improvement of about 10% to about 70% relative to the same physical property as measured in the first region 120 using the same testing conditions or standard industry testing conditions. In another embodiment, the at least one improved physical property exhibited by the second region 150 provides an improvement of about 20% to about 60% relative to the same physical property as measured in the first region 120 using the same testing conditions, or standard industry testing conditions.

In one embodiment, a welding or brazing material used to repair the second region 150 has about 10% to about 95% improved oxidation resistance when compared to the oxidation resistance of a welding material which is suitable for repairing a molded article cast from only one casting material. In another embodiment, a welding or brazing material used to repair the second region 150 has about 20% to about 95% improved oxidation resistance when compared to the oxidation resistance of a welding material which is suitable for repairing a molded article cast from only one casting material. In yet another embodiment, a welding or brazing material used to repair the second region 150 has about 30% to about 95% improved oxidation resistance when compared to the oxidation resistance of a welding material which is suitable for repairing a molded article cast from only one casting material. In still another embodiment, a welding or brazing material used to repair the second region 150 has about 40% to about 95% improved oxidation resistance when compared to the oxidation resistance of a welding material which is suitable for repairing a molded article cast from only one casting material.

In one embodiment, the second casting material 130 comprises at least one material which has superior weld fabrication properties and at least one material which has inferior weld fabrication properties to form a second region which has improved weld fabrication properties when compared to a molded article cast from only one casting material. In another embodiment, in comparison to a molded article cast form only one single casting material, or separate castings each cast from only one casting material, the superior weld fabrication properties of the second casting material 130 provide a second region 150 which, if not produced integrally with the first region, is not capable of being welded to the first region 120.

In one embodiment, the second region 150, whether the microstructure pattern is primarily or completely single crystal, columnar or equiaxed, demonstrates a comparable creep property, or degree of isothermal creep rupture, as the same region of a molded article formed only from the first casting material or from a single casting material. In another embodiment, the second region 150, whether the microstructure pattern is primarily or completely single crystal, columnar or equiaxed, demonstrates a creep property within a range of about 0% to about 40%, or degree of isothermal creep rupture, as the creep property demonstrated in the same region of a molded article formed only from the first casting material or from a single casting material. In yet another embodiment, the second region 150, whether the microstructure pattern is primarily or completely single crystal, columnar or equiaxed, demonstrates a creep property within a range of about 0% to about 30%, or degree of isothermal creep rupture, as the creep property demonstrated in the same region of a molded article formed only from the first casting material or from a single casting material. In still another embodiment, the second region 150, whether the microstructure pattern is primarily or completely single crystal, columnar or equiaxed, demonstrates a creep property within a range of about 0% to about 20%, or degree of isothermal creep rupture, as the creep property demonstrated in the same region of a molded article formed only from the first casting material or from a single casting material. In still yet another embodiment, the second region 150, whether the microstructure pattern is primarily or completely single crystal, columnar or equiaxed, demonstrates a creep property within a range of about 0% to about 10%, or degree of isothermal creep rupture, as the creep property demonstrated in the same region of a molded article formed only from the first casting material or from a single casting material.

In one embodiment, the second region 150, demonstrates less total corrosion over time and greater oxidation resistance than that demonstrated in the same region of a molded article formed only from the first casting material or from a single casting material. In another embodiment, the second region 150, demonstrates from about 10% to about 95% less total corrosion over time and greater oxidation resistance than that demonstrated in the same region of a molded article formed only from the first casting material or from a single casting material. In yet another embodiment, the second region 150, demonstrates from about 30% to about 95% less total corrosion over time and greater oxidation resistance than that demonstrated in the same region of a molded article formed only from the first casting material or from a single casting material. In still yet another embodiment, the second region 150, demonstrates from about 50% to about 95% less total corrosion over time and greater oxidation resistance than that demonstrated in the same region of a molded article formed only from the first casting material or from a single casting material.

In one embodiment, the second region 150, demonstrates a total corrosion over 10,000 hours of less than 10 mils/side. In another embodiment, the second region 150, demonstrates a total corrosion over 12,000 hours of less than or equal to 20 mils/side. In yet another embodiment, the second region 150, demonstrates a total corrosion over 100,000 hours of less than or equal to 60 mils/side. In still yet another embodiment, the second region 150, demonstrates a total corrosion over 100,000 hours of less than or equal to 50 mils/side.

In one embodiment, the second region 150, demonstrates low cycle fatigue (LCF) or strain of about 10 cycles to crack initiation or more after the same region of a molded article formed only from the first casting material or a single casting material demonstrates crack initiation. In another embodiment, the second region 150, demonstrates low cycle fatigue (LCF) of about 50 cycles to crack initiation or more after the same region of a molded article formed only from the first casting material or a single casting material demonstrates crack initiation. In yet another embodiment, the second region 150, demonstrates low cycle fatigue (LCF) of about 100 cycles to crack initiation or more after the same region of a molded article formed only from the first casting material or a single casting material demonstrates crack initiation. In still yet another embodiment, the second region 150, demonstrates low cycle fatigue (LCF) of about 150 cycles to crack initiation or more after the same region of a molded article formed only from the first casting material or a single casting material demonstrates crack initiation.

In one embodiment, the molded article is a component in a gas turbine engine. The gas turbine engine component is used in any gas turbine engine application, including but not limited to, commercial and military aircraft, power generation and marine propulsion. Referring to FIG. 5, a gas turbine engine component is a stage 1 turbine bucket 170 used in a gas turbine engine. The stage 1 turbine bucket 170 comprises a blade 180 and a hub 190. In one embodiment, the blade 180 further comprises a squealer tip 200. During operation of the gas turbine engine, the squealer tip 200 is subjected to operating conditions such as temperatures up to about 1100° C., frictional motion and/or rotary motion. Such operating conditions induce a reduction in one or more physical properties of the squealer tip 200.

Referring to FIG. 6, an enlarged view of the blade 180 and the squealer tip 200 portion of the stage 1 turbine bucket 170 of FIG. 5 is shown. The blade 180 comprises a first region 210 and a second region 220, corresponding to the first region 120 and the second region 150, respectively, of FIGS. 1-4 as defined herein. The second region 220 corresponds to the squealer tip 200 portion of the blade 180. The first region 210 corresponds to the remaining balance of the blade 180. In this embodiment, the second region 220 provides targeted reinforcement of at least one physical property to the squealer tip 200 portion of the blade 180. In one embodiment, this targeted reinforcement prevents or significantly reduces thermally induced cracking, reduces material loss and/or increases the weldability of the squealer tip 200.

Referring to FIG. 7, in another embodiment, the molded article is a latter stage (shrouded) turbine bucket 230. A schematic representation of an enlarged view of the latter stage shrouded bucket 230 used in a gas turbine engine is shown. The latter stage (shrouded) turbine bucket 230 comprises a blade 240 and a hub (not shown). The blade 240 further comprises a fillet tip 250. The tip shroud 250 portion of the blade 240 in the latter stage turbine bucket is subjected to various physical and/or thermal stresses, such as creep strain. The blade 240 comprises a first region 260 and a second region 270, corresponding to the first region 120 and the second region 150, respectively, of FIGS. 1-4 as defined herein. The second region 270 corresponds to the fillet tip 250 portion of the blade 240. In this embodiment, the second region 270 provides targeted reinforcement of at least one physical property to the tip shroud 250 portion of the blade 240. This targeted reinforcement prevents or significantly reduces creep damage in the tip shroud 250 portion of the blade 240.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

The invention claimed is:
1. A molded article comprising:
a first region formed by a first casting material; and a second region formed by mixing a molten or liquid portion of the first casting material and a second casting material, wherein the first casting material has a different chemical composition than the second casting material, wherein the first region and the second region are cast as one integral casting using directional solidification, and wherein the second region exhibits reduced thermal cracking relative to the first region.

2. The molded article of claim 1, wherein the molded article has a lower concentration of impurities than were present in the first casting material and the second casting material.

3. The molded article of claim 1, wherein the first region and the second region have different microstructure patterns.

4. The molded article of claim 1, wherein the second region further exhibits reduced material loss relative to the first region.

5. The molded article of claim 1, wherein thermal cracking is reduced by about 5% to about 80% in the second region relative to the first region using the same testing conditions.

6. A molded turbine bucket for use in a gas turbine engine, the turbine bucket comprising:
 a hub; and
 a blade, the blade including
  a first region formed by a first casting material, and
  a second region formed by mixing a molten or liquid portion of the first casting material and a second casting material,
 wherein the first casting material has a different chemical composition than the second casting material and the first region and the second region are cast as one integral casting using directional solidification,
 wherein the second region exhibits reduced thermal cracking relative to the first region, and
 wherein the second region corresponds to a tip portion of the blade and the first region corresponds to the remaining balance of the blade.

7. The turbine bucket of claim 6, wherein the turbine bucket has a lower concentration of impurities than were initially present in the first casting material and the second casting material when they each were introduced into a casting mold to mold the turbine bucket.

8. The turbine bucket of claim 6, wherein the turbine bucket is a stage 1 turbine bucket and the tip portion of the blade is a squealer tip.

9. The turbine bucket of claim 6, wherein the turbine bucket is a latter stage turbine bucket, and wherein the tip portion of the blade is a tip shroud.

10. The turbine bucket of claim 9, wherein the second region provides targeted reinforcement to prevent or significantly reduce creep damage in the tip shroud.

* * * * *